United States Patent
Ebenezer et al.

(10) Patent No.: US 7,746,059 B2
(45) Date of Patent: Jun. 29, 2010

(54) CURRENT MEASUREMENT APPARATUS

(75) Inventors: Desmond Ebenezer, UpHolland (GB); Albert Zwolinski, Appley Bridge (GB)

(73) Assignee: Lem Heme Limited, Skelmersdale, Lancashire (GB)

( * ) Notice: Subject to any disclaimer, the term of this patent is extended or adjusted under 35 U.S.C. 154(b) by 184 days.

(21) Appl. No.: 10/599,843

(22) PCT Filed: Mar. 29, 2005

(86) PCT No.: PCT/GB2005/001226

§ 371 (c)(1),
(2), (4) Date: May 30, 2007

(87) PCT Pub. No.: WO2005/106507

PCT Pub. Date: Nov. 10, 2005

(65) Prior Publication Data

US 2007/0210787 A1    Sep. 13, 2007

(30) Foreign Application Priority Data

Apr. 29, 2004  (GB) ................... 0409549.3

(51) Int. Cl.
*G01R 15/18* (2006.01)
(52) U.S. Cl. ..................................... 324/127
(58) Field of Classification Search .................. None
See application file for complete search history.

(56) References Cited

U.S. PATENT DOCUMENTS

| | | | |
|---|---|---|---|
| 5,742,165 A * | 4/1998 | Snelten et al. ............... 324/318 |
| 5,852,395 A | 12/1998 | Bosco et al. | |
| 5,933,012 A | 8/1999 | Bengtsson et al. | |
| 6,313,623 B1 * | 11/2001 | Kojovic et al. ............... 324/127 |
| 6,559,651 B1 * | 5/2003 | Crick ........................... 324/522 |
| 6,885,183 B2 * | 4/2005 | Kato ........................ 324/117 R |
| 7,474,192 B2 * | 1/2009 | Skendzic et al. ............. 336/225 |
| 2007/0226989 A1 * | 10/2007 | Skendzic et al. ............. 336/223 |
| 2007/0236208 A1 * | 10/2007 | Kojovic et al. ............... 324/127 |

FOREIGN PATENT DOCUMENTS

EP          1 394 818          3/2004

OTHER PUBLICATIONS

International Search Report for PCT Application No. PCT/GB05/001226 dated Jun. 16, 2005.
Wapakabulo et al. "Braid Rogowski Coil" *Electronics Letters, IEE Stevenage, GB* 35(17): 1445-1446 (Aug. 19, 1999).
Written Opinion of the International Searching Authority for PCT Application No. GB/2005/001226.

* cited by examiner

*Primary Examiner*—Jermele M Hollington
(74) *Attorney, Agent, or Firm*—James B. Conte; HBSWK

(57) ABSTRACT

The current measurement apparatus comprises a Rogowski coil 20 comprising a wire or conductor which forms a coil 22 and returns through the coil 22 as a central conductor. The coil 22 and the central conductor are formed from a single conductor or wire and, therefore, no electrical join (for example, a solder join or crimp) is required at the end of the Rogowski coil. The wire 28 used to form the coil 22 and the central conductor 24 is insulated prior to forming the Rogowski coil. The insulated coating 30 provides better insulation between individual coils and also helps to provide a more even spacing between the coils.

23 Claims, 2 Drawing Sheets

CURRENT MEASUREMENT APPARATUS

FIELD OF THE INVENTION

The present invention relates current measurement apparatus and a method of measuring current and, in particular, pulsed or alternating currents.

This application is a 371 of PCT/GB05/01226 filed on Mar. 29, 2005.

BACKGROUND TO THE INVENTION

The Rogowski Coil was invented by Chattock in the 1880's (Chattock A. P. On a magnetic potentiometer Philos Mag., 1887 pp 94-96). It is a flexible solenoid with a co-axial return conductor and is used in non-intrusive manner to sense the magnetic field generated by a current carrying conductor by encircling said conductor. The output of the Rogowski Coil is a voltage proportional to the derivative or rate of change of the current being measured. Means need to be provided to integrate this voltage output to create a voltage output proportional to the current being measured.

Based on Ampere's theorem, if a solenoid of length 1 having N turns of area A, and a pitch of n=N/1, encircles the current carrying conductor perpendicularly with a radius R=1/2π centred around said conductor, the magnetic field B at the centre of each turn is given by $B=\mu_0 i(t)/(2\pi R)$. Provided that $A<<R^2$ the flux per turn is AB(t) which leads to the familiar equation for the output of a Rogowski coil being $e(t)=-Nd(AB(t)/dt=-\mu_0 nAdi(t)/dt$.

The Rogowski coil only integrates the rate of change of flux density B correctly if the coil layout is closed.

Any deviation from this closed loop results in an incomplete line integral, as defined by Ampere's Theorem, and therefore, a degraded accuracy in measurement of the current.

The present state of the art flexible Rogowski coils tend to use butt joins given the nature of the loop closing coupling designs resulting in erroneous measurements. However, other joint designs are also used e.g., right angle joints and parallel joints. By winding extra turns at the butt joint interface improvements to accuracy are possible.

Industrial International Safety Standards e.g., IEC 61010 prescribe minimum creepage and clearance distances which further exacerbate the situation with regard to measurement performance.

The wire contained in a Rogowski coil is generally provided with an insulated covering or coating. Functional insulation for safety purposes as described in safety standards (e.g. EN61010-1:2001 Clause 6.9.1) comprise that the following shall not be used as insulation for safety purposes; (1) materials which can be easily damaged (e.g. physically damaged) for example lacquer, enamels, oxides, anodic films, and (2) non-impregnated hygrospic materials (for example preferably the wire is provided with functional insulation for safety purposes and preferably as described in appropriate safety standards).

It is an aim of the present invention to overcome at least one problem associated with the prior art whether referred to herein or otherwise.

SUMMARY OF THE INVENTION

According to a first aspect of the present invention there is provided current measurement apparatus comprising a Rogowski coil wherein the Rogowski coil comprises a wire which is insulated prior to forming the Rogowski coil.

Preferably the wire is insulated for safety purposes.

Preferably the wire is insulated by insulating material.

Preferably the insulating material is resistant to physical damage.

Preferably the insulating material cannot be easily damaged and preferably cannot be easily physically damaged.

Preferably the insulating material comprises a resilient material.

For safety purposes, the following types of materials may not be considered suitable: a) materials which can be easily damaged (for example, lacquer, enamel, oxides, anodic films etc); b) non-impregnated hygroscopic materials (for example, paper, fibres, fibrous materials etc).

Preferably the complete outer surface of the wire is coated with an insulating material which preferably provides insulation and more preferably reinforced insulation (referred to in this document as insulation). In particular, the outer surface of the wire is insulated and not merely coated.

Preferably the insulating material comprises a wrapping for the wire or an extrusion for the wire. Preferably the insulation material is not applied to the wire (for example lacquer).

Preferably the Rogowski coil comprises a single insulated wire which provides a central conductor and a coil and more preferably comprises a single homogeneous insulated wire which provides a central conductor and a coil.

The insulation coating may be less than 0.25 mm and preferably is less than 0.175 mm and more preferably is less than or equal to 0.125 mm.

Preferably the Rogowski coil is formed by providing a straight central conductor section and winding a coil around at least a part of the straight electrical conductor section. The Rogowski coil may comprise an inner sheath (for example a dielectric sheath) and the inclusion of such a sheath may depend upon the output characteristic requirements of the Rogowski coil.

Preferably the wire comprises copper wire.

Preferably the Rogowski coil comprises an end wherein the end does not require an insulation cap.

Preferably the wire is insulated along substantially the complete length thereof.

The wire may comprise a plurality of layers of insulating material. The wire may comprise two, three or more layers of insulating material.

Preferably the Rogowski coil comprises a first end and a second end. Preferably, in use, the first end is arranged, in use, to locate adjacent to the second end. Preferably, in use, a first end member located on the first end is arranged, in use, to engage a second end member located on the second end.

Preferably a first end member located on one end of the Rogowski coil is arranged, in use, to cooperate with a second end member located on a second end of the Rogowski coil.

Preferably the, in use, a first end of the Rogowski coil is arranged, in use, to locate (or cooperate or engage) a second end member located on a second end of the Rogowski coil in order to form a continguous loop or circle.

Preferably a first end of the Rogowski coil is arranged to magnetically cooperate with the second end of the Rogowski coil and preferably form a contiguous loop or circle.

Preferably a first end member locates on or towards a first end of the Rogowski coil and a second end member locates or towards a second end of the Rogowski coil.

The first end member may comprise a female member and the second end member may comprise a male member. Preferably at least a part of the male member is arranged, in use, to locate on a part of the female member.

The first end member may comprise a magnetic member.

The second end member may comprise a magnetic member.

The second end member may comprise a metal.

The second end member may comprise a plate or planar member.

Preferably the first end member is arranged, in use, to be secured to the second end member solely by magnetic force.

According to a second aspect of the present invention there is provided a method of forming current measurement apparatus comprising forming a Rogowski coil from an insulated wire.

The method may comprise forming a central conductor section and forming a coil around the central conductor section using insulated wire.

According to a third aspect of the present invention there is provided a method of measuring current comprising using current measurement apparatus in accordance with the first aspect of the present invention.

According to a fourth aspect of the present invention there is provided a method of measuring current comprising using current measurement apparatus formed in accordance with the third aspect of the present invention.

BRIEF DESCRIPTION OF THE DRAWINGS

The present invention will now be described, by way of example only, with reference to the drawings that follow, in which.

DESCRIPTION OF THE PREFERRED EMBODIMENT

Figure 3:
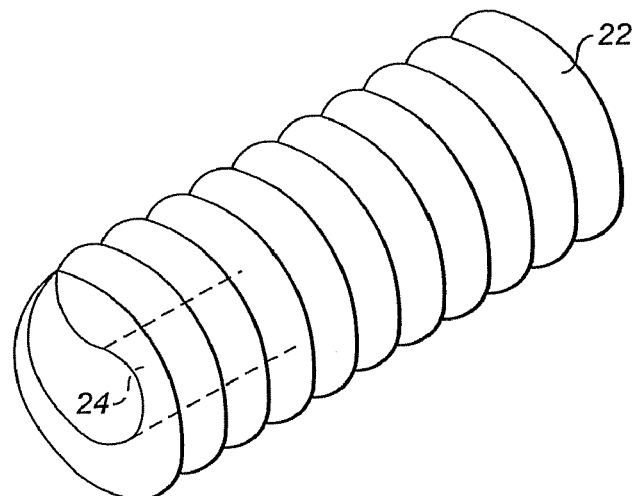
FIG. 3 is a perspective view of part of a preferred embodiment of a Rogowski coil in accordance with the present invention.

As shown in FIG. 3, a preferred embodiment of electric current measurement apparatus comprises a Rogowski coil 20 comprising a wire or conductor which forms a coil 22 and returns through the coil 22 as a central conductor 24. The coil 22 and the central conductor 24 are formed form a single conductor or wire and, therefore, no electrical joint (for example, a solder join or crimp) is required at the end of the Rogowski coil 20. Such joints are required in prior art Rogowski coils. Accordingly, the coil 22 and conductor 24 are formed from a seamless conductive member, which by itself is seamless.

Figure 4:
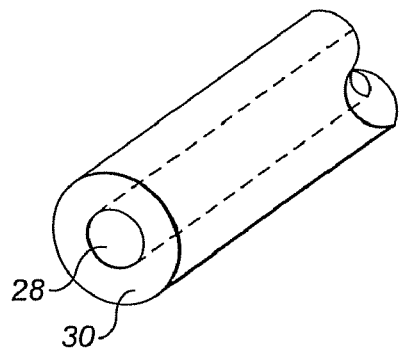
FIG. 4 is a perspective view of part of a preferred embodiment of an insulated wire for use in a preferred embodiment of a Rogowski coil.

The wire 28 used to form the coil 22 and the central conductor 24 is insulated prior to forming the Rogowski coil 20, as shown in FIG. 4. The wire is coated with the required amount of insulation 30 or insulation material. The wire is not merely coated with a coating material since this would not provide the necessary insulation characteristics. The insulated coating 30 on the wire provides better insulation between individual coils and also helps provide a more even spacing between coils relative to providing insulating sheaths or sleeves. The wire is copper and the outer surface thereof is completely coated along the length thereof. However, the end of the wire enable the wire to be electrically connected to measurement apparatus to measure the induced current in the Rogowski coil and, therefore, to calculate the electrical current in a conductor 32.

The wire is covered with a functional insulation material for safety purposes as described in safety standards (for example EN 61010-1:2001 Clause 6.9.1). Such standards exclude the following for use as insulation for safety purposes; (1) materials which can be easily damaged (for example, lacquer, enamels, oxides, anodic films), and (2) non-impregnated hygroscopic materials (for example, paper fibrous material). Accordingly, the insulating material comprises a resilient material to prevent or at least inhibit physical damage thereof. In addition, the insulation material comprises a water resistant material.

The wire is coated or covered by a plurality of layers of insulating material and is the preferred embodiment comprises triple insulated material having three concentric layers of insulating material around the wire. In particular, the insulating material of the present invention is wrapped or extruded rather than applied as a lacquer would.

Figure 1:
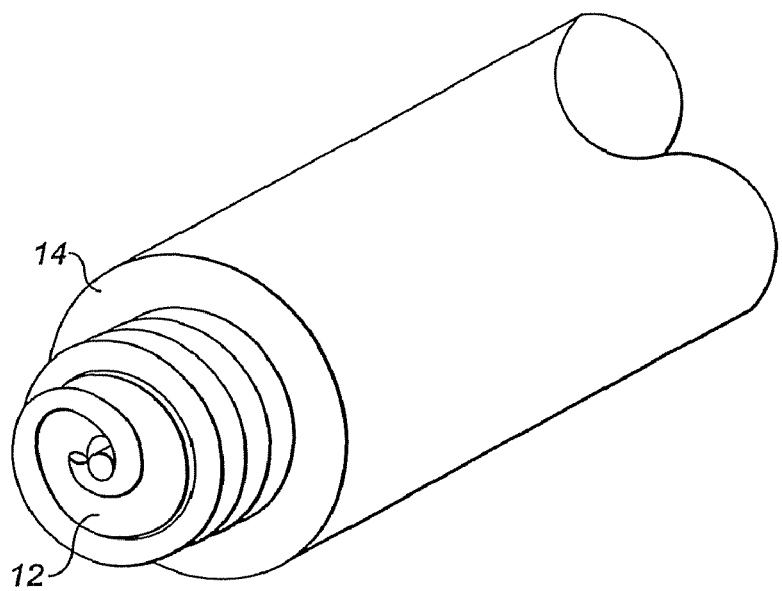
FIG. 1 is a perspective view of part of a prior art Rogowski coil.
Figure 2:
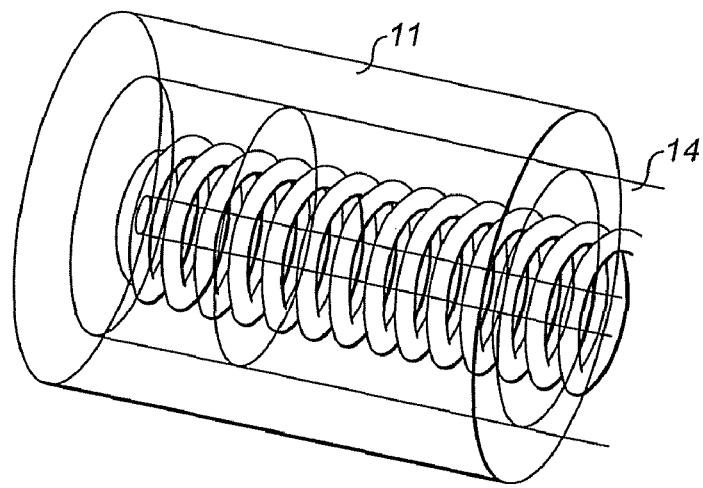
FIG. 2 is a perspective view of part of an end of a prior art Rogowski coil including an end cap.

The coil end would only require protection from physical abuse and/or damage. The coil end of prior art Rogowski coils require an insulation cap 11 to further insulate the end of the Rogowski coil as shown in FIG. 2. The coil 22 and central conductor 24 of the present invention have a natural electrical safety barrier built into the construction. In addition, in a coil formed using the pre-insulated wire there would be no other requirement for protection other than for physical abuse and/or damage.

The preferred embodiment provides 600V rating with triple insulated wire. The insulation coating 30 in the copper wire 28 is substantially equal to or less than 0.125 mm.

That is the radial thickness of the insulation is equal to or less than 0.125 mm. For higher voltages, the insulation coating may be thicker. The dielectric breakdown voltage would be greater than 1 kV or as appropriate for the voltage ratio required.

Figure 5:
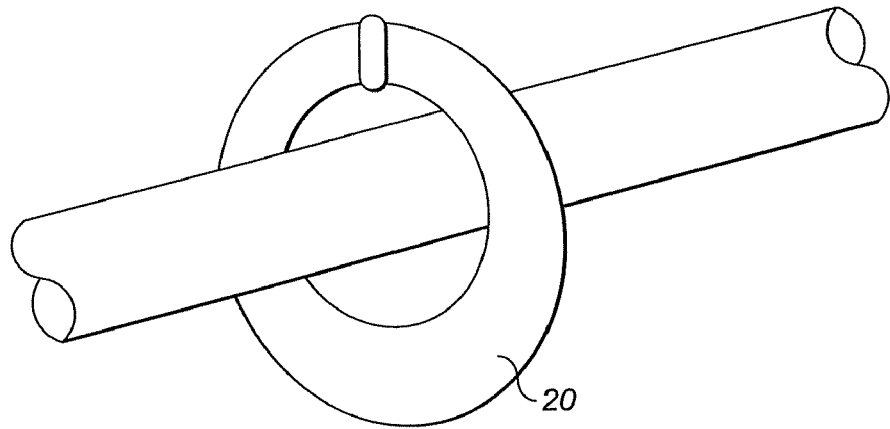
FIG. 5 is a perspective view of a preferred embodiment of a Rogowski coil, in use.

Since the wire forming the coil 22 and straight conductor section 24 is pre-insulated the physical dimension of the Rogowski coil are minimised and also an end cap to provide insulation is not required. Prior art Rogowski coils are relatively bulky since they include an inner dielectric sheath 12 and an outer sheath 14 or jacket that is thick enough to provide for electrical safety and physical abuse. In use, the Rogowski coil 20 is located around an electrical conductor 32 in order for the Rogowski coil to measure be current in the electrical conductor 32, as shown in FIG. 5.

The present invention results in the Rogowski coil being smaller, better insulated and does not require an end insulting cap for intrinsic safety.

The present invention may include an inner dielectric sheath and the use of such a sheath may provide better insulation. The use of such a sheath may depend upon the output characteristics of the Rogowski coil.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

The invention claimed is:

1. Current measurement apparatus comprising a Rogowski coil wherein the Rogowski coil comprises a seamless conductive member, wherein the conductive member by itself is seamless, said single conductive member forms a coil and a central conductor extending through the coil wherein said conductive member forms single homogeneous wire and said homogeneous wire is insulated prior to forming the Rogowski coil.

2. Current measurement apparatus according to claim 1 in which the wire is insulated by insulating material.

3. Current measurement apparatus according to claim 2 in which the insulating material is resistant to physical damage.

4. Current measurement apparatus according to claim 2 in which the complete outer surface of the wire is coated with an insulating material.

5. Current measurement apparatus according to claim 4 in which the complete outer surface of the wire is coated with an insulating material which provides reinforced insulation.

6. Current measurement apparatus according to claim 2 in which the insulating material comprises a wrapping for the wire.

7. Current measurement apparatus according to claim 2 in which the insulating material is an extrusion.

8. Current measurement apparatus according to claim 1 in which the insulation coating is less than or equal to 0.125 mm.

9. Current measurement apparatus according to claim 1 in which the Rogowski coil is formed by providing a straight central conductor section and winding a coil around at least a part of the straight electrical conductor section.

10. Current measurement apparatus according to claim 1 in which the Rogowski coil comprises an inner sheath.

11. Current measurement apparatus according to claim 1 in which the wire comprises copper wire.

12. Current measurement apparatus according to claim 1 in which the Rogowski coil comprises an end wherein the end does not require an insulation cap.

13. Current measurement apparatus according to claim 1 in which the wire comprises a plurality of layers of insulating material.

14. Current measurement apparatus according to claim 1 in which the Rogowski coil comprises a first end and a second end.

15. Current measurement apparatus according to claim 14 in which, in use, the first end is arranged, in use, to locate adjacent to the second end.

16. Current measurement apparatus according to claim 14 in which, a first end member located on the first end is arranged, in use, to engage a second end member located on the second end.

17. Current measurement apparatus according to claim 1 in which a first end member located on one end of the Rogowski coil is arranged, in use, to cooperate with a second end member located on a second end of the Rogowski coil.

18. Current measurement apparatus according to claim 1 in which, in use, a first end of the Rogowski coil is arranged, in use, to cooperate with a second end member located on the second end of the Rogowski coil in order to form a contiguous loop.

19. Current measurement apparatus according to claim 1 in which a first end of the Rogowski coil is arranged to magnetically cooperate with a second end of the Rogowski coil.

20. Current measurement apparatus according to claim 16 in which the first end member comprises a female member and the second end member comprises a male member.

21. Current measurement apparatus according to claim 16 in which the first end member is arranged, in use, to be secured to the second end member solely by magnetic force.

22. A method of forming current measurement apparatus comprising forming a Rogowski coil from a seamless conductive member, wherein the conductive member by itself is seamless; forming said seamless conductive member into a coil and a central conductor extending through the coil; insulating said seamless conductive member before forming said coil and central conductor.

23. A Rogowski coil having a seamless conductive member, wherein said conductive member by itself is seamless, said seamless conductive member forms a coil and a central conductor extending through a center of the coil, and the seamless conductive element is insulated.

* * * * *